US008107280B2

(12) United States Patent
Yoon et al.

(10) Patent No.: US 8,107,280 B2
(45) Date of Patent: Jan. 31, 2012

(54) WORD LINE VOLTAGE CONTROL IN STT-MRAM

(75) Inventors: Sei Seung Yoon, San Diego, CA (US); Mehdi Hamidi Sani, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 194 days.

(21) Appl. No.: 12/265,044

(22) Filed: Nov. 5, 2008

(65) Prior Publication Data

US 2010/0110775 A1 May 6, 2010

(51) Int. Cl.
*G11C 11/00* (2006.01)
*G11C 11/14* (2006.01)
*G11C 11/15* (2006.01)
*G11C 8/00* (2006.01)

(52) U.S. Cl. .... 365/158; 365/171; 365/173; 365/230.06
(58) Field of Classification Search .................. 365/148, 365/158, 171, 173, 230.06; 327/536
See application file for complete search history.

(56) References Cited

U.S. PATENT DOCUMENTS

| | | | | |
|---|---|---|---|---|
| 5,398,207 A * | 3/1995 | Tsuchida et al. | ......... | 365/230.06 |
| 6,181,637 B1 * | 1/2001 | Nishimura et al. | ...... | 365/230.06 |
| 6,873,561 B2 * | 3/2005 | Ooishi | .......................... | 365/158 |
| 6,876,246 B2 * | 4/2005 | Kim | ............................. | 327/536 |
| 7,009,874 B2 * | 3/2006 | Deak | ............................. | 365/158 |
| 7,085,190 B2 * | 8/2006 | Worley et al. | ............ | 365/230.06 |
| 7,106,649 B2 * | 9/2006 | Wada et al. | .............. | 365/230.06 |
| 7,110,282 B2 * | 9/2006 | Kono et al. | .............. | 365/230.06 |
| 7,301,829 B2 * | 11/2007 | Honda et al. | ................... | 365/158 |
| 7,345,912 B2 * | 3/2008 | Luo et al. | ....................... | 365/158 |
| 7,349,245 B2 * | 3/2008 | Kim et al. | ....................... | 365/158 |
| 7,436,699 B2 * | 10/2008 | Tanizaki et al. | ............... | 365/158 |
| 7,515,457 B2 * | 4/2009 | Chen et al. | .................... | 365/158 |
| 7,742,329 B2 * | 6/2010 | Yoon et al. | .................... | 365/158 |
| 2004/0240279 A1 | 12/2004 | Kwon | | |
| 2008/0205121 A1 | 8/2008 | Chen | | |
| 2009/0104718 A1 * | 4/2009 | Zhong et al. | | |

FOREIGN PATENT DOCUMENTS

WO 2008109768 9/2008

OTHER PUBLICATIONS

International Search Report-PCT/US2009/063245, International Search Authority-European Patent Office Jan. 25, 2010.
Written Opinion-PCT/ US2009/063245, International Search Authority-European Patent Office Jan. 25, 2010.

* cited by examiner

*Primary Examiner* — Trong Phan
(74) *Attorney, Agent, or Firm* — Sam Talpalatsky; Nicholas J. Pauley; Jonathan T. Velasco

(57) ABSTRACT

Systems, circuits and methods for controlling the word line voltage applied to word line transistors in Spin Transfer Torque Magnetoresistive Random Access Memory (STT-MRAM) are disclosed. One embodiment is directed to a STT-MRAM including a bit cell having a magnetic tunnel junction (MTJ) and a word line transistor. The bit cell is coupled to a bit line and a source line. A word line driver is coupled to a gate of the word line transistor. The word line driver is configured to provide a word line voltage greater than a supply voltage below a transition voltage of the supply voltage and to provide a voltage less than the supply voltage for supply voltages above the transition voltage.

21 Claims, 7 Drawing Sheets

READ & WRITE

WORD LINE VOLTAGE CONTROL IN STT-MRAM

FIELD OF DISCLOSURE

Embodiments of the invention are related to random access memory (RAM). More particularly, embodiments of the invention are related to word line voltage control in Spin Transfer Torque Magnetoresistive Random Access Memory (STT-MRAM).

BACKGROUND

Random access memory (RAM) is a ubiquitous component of modern digital architectures. RAM can be stand alone devices or can be integrated or embedded within devices that use the RAM, such as microprocessors, microcontrollers, application specific integrated circuits (ASICs), system-on-chip (SoC), and other like devices as will be appreciated by those skilled in the art. RAM can be volatile or non-volatile. Volatile RAM loses its stored information whenever power is removed. Non-volatile RAM can maintain its memory contents even when power is removed from the memory. Although non-volatile RAM has advantages in the ability to maintain its contents without having power applied, conventional non-volatile RAM has slower read/write times than volatile RAM.

Magnetoresistive Random Access Memory (MRAM) is a non-volatile memory technology that has response (read/write) times comparable to volatile memory. In contrast to conventional RAM technologies which store data as electric charges or current flows, MRAM uses magnetic elements. As illustrated in FIGS. 1A and 1B, a magnetic tunnel junction (MTJ) storage element 100 can be formed from two magnetic layers 110 and 130, each of which can hold a magnetic field, separated by an insulating (tunnel barrier) layer 120. One of the two layers (e.g., fixed layer 110), is set to a particular polarity. The other layer's (e.g., free layer 130) polarity 132 is free to change to match that of an external field that can be applied. A change in the polarity 132 of the free layer 130 will change the resistance of the MTJ storage element 100. For example, when the polarities are aligned, FIG. 1A, a low resistance state exists. When the polarities are not aligned, FIG. 1B, then a high resistance state exists. The illustration of MTJ 100 has been simplified and those skilled in the art will appreciate that each layer illustrated may comprise one or more layers of materials, as is known in the art.

Referring to FIG. 2A, a memory cell 200 of a conventional MRAM is illustrated for a read operation. The cell 200 includes a transistor 210, bit line 220, digit line 230 and word line 240. The cell 200 can be read by measuring the electrical resistance of the MTJ 100. For example, a particular MTJ 100 can be selected by activating an associated transistor 210, which can switch current from a bit line 220 through the MTJ 100. Due to the tunnel magnetoresistive effect, the electrical resistance of the MTJ 100 changes based on the orientation of the polarities in the two magnetic layers (e.g., 110, 130), as discussed above. The resistance inside any particular MTJ 100 can be determined from the current, resulting from the polarity of the free layer. Conventionally, if the fixed layer 110 and free layer 130 have the same polarity, the resistance is low and a "0" is read. If the fixed layer 110 and free layer 130 have opposite polarity, the resistance is higher and a "1" is read.

Referring to FIG. 2B, the memory cell 200 of a conventional MRAM is illustrated for a write operation. The write operation of the MRAM is a magnetic operation. Accordingly, transistor 210 is off during the write operation. Current is propagated through the bit line 220 and digit line 230 to establish magnetic fields 250 and 260 that can affect the polarity of the free layer of the MTJ 100 and consequently the logic state of the cell 200. Accordingly, data can be written to and stored in the MTJ 100.

MRAM has several desirable characteristics that make it a candidate for a universal memory, such as high speed, high density (i.e., small bitcell size), low power consumption, and no degradation over time. However, MRAM has scalability issues. Specifically, as the bit cells become smaller, the magnetic fields used for switching the memory state increase. Accordingly, current density and power consumption increase to provide the higher magnetic fields, thus limiting the scalability of the MRAM.

Unlike conventional MRAM, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During the write operation, the spin-polarized electrons exert a torque on the free layer, which can switch the polarity of the free layer. The read operation is similar to conventional MRAM in that a current is used to detect the resistance/logic state of the MTJ storage element, as discussed in the foregoing. As illustrated in FIG. 3A, a STT-MRAM bit cell 300 includes MTJ 305, transistor 310, bit line 320 and word line 330. The transistor 310 is switched on for both read and write operations to allow current to flow through the MTJ 305, so that the logic state can be read or written.

Referring to FIG. 3B, a more detailed diagram of a STT-MRAM cell 301 is illustrated, for further discussion of the read/write operations. In addition to the previously discussed elements such as MTJ 305, transistor 310, bit line 320 and word line 330, a source line 340, sense amplifier 350, read/write circuitry 360 and bit line reference 370 are illustrated. As discussed above, the write operation in an STT-MRAM is electrical. Read/write circuitry 360 generates a write voltage between the bit line 320 and the source line 340. Depending on the polarity of the voltage between bit line 320 and source line 340, the polarity of the free layer of the MTJ 305 can be changed and correspondingly the logic state can be written to the cell 301. Likewise, during a read operation, a read current is generated, which flows between the bit line 320 and source line 340 through MTJ 305. When the current is permitted to flow via transistor 310, the resistance (logic state) of the MTJ 305 can be determined based on the voltage differential between the bit line 320 and source line 340, which is compared to a reference 370 and then amplified by sense amplifier 350. Those skilled in the art will appreciate the operation and construction of the memory cell 301 is known in the art. Additional details are provided, for example, in M. Hosomi, et al., A Novel Nonvolatile Memory with Spin Transfer Torque Magnetoresistive Magnetization Switching: Spin-RAM, proceedings of IEDM conference (2005), which is incorporated herein by reference in its entirety.

The electrical write operation of STT-MRAM eliminates the scaling problem due to the magnetic write operation in MRAM. Further, the circuit design is less complicated for STT-MRAM. However, fluctuations in the core operating voltage Vdd can cause cell read current to approach or be higher than the write current threshold, and thus cause an invalid write operation and/or potential damage to system components. Inversely, fluctuations in Vdd can drive the operating voltage down to an undesirably low level that can decrease system performance and potentially prevent the system from functioning properly or at all.

SUMMARY

Exemplary embodiments of the invention are directed to systems, circuits and methods for controlling the word line voltage applied to word line transistors in STT-MRAM.

One embodiment is directed to a STT-MRAM comprising: a bit cell having a magnetic tunnel junction (MTJ) and a word line transistor, wherein the bit cell is coupled to a bit line and a source line; and a word line driver coupled to a gate of the word line transistor, wherein the word line driver is configured to provide a word line voltage greater than a supply voltage below a transition voltage of the supply voltage and to provide a voltage less than the supply voltage for supply voltages above the transition voltage.

Another embodiment is directed to a method for read and write operations in a STT-MRAM. The method comprises: applying a first voltage to a gate of a word line transistor of a bit cell during a write operation, wherein the first voltage is higher than a supply voltage if the supply voltage is lower than a transition voltage; and applying a second voltage to the word line transistor during a write operation, wherein the second voltage is lower than the supply voltage if the supply voltage is higher than a transition voltage.

Another embodiment is directed to a STT-MRAM comprising: means for applying a first voltage to a gate of a word line transistor of a bit cell during a write operation, wherein the first voltage is higher than a supply voltage if the supply voltage is lower than a transition voltage; and means for applying a second voltage to the word line transistor during a write operation, wherein the second voltage is lower than the supply voltage if the supply voltage is higher than a transition voltage.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of embodiments of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of embodiments of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation. It will be appreciated that a "pumping voltage" as used herein may provide either a higher or lower voltage power source.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

As discussed in the background, STT-MRAM uses a low write current for each cell, which is an advantage of this memory type over MRAM. However, fluctuations in the core operating voltage Vdd can cause cell read current to approach or be higher than the write current threshold, and thus cause an invalid write operation and/or potential damage to system components. Inversely, fluctuations in Vdd can drive the operating voltage down to an undesirably low level that can decrease system performance and potentially prevent the system from functioning properly or at all. In contrast, embodiments of the invention control the WL transistor strength using a word line driver to generate a word line voltage $V_{WL}$ based on Vdd. According to various embodiments, if Vdd is below a limit voltage, such as a safe operation threshdhold, $V_{WL}$ can be provided at a voltage greater than Vdd to increase performance. If Vdd is above the limit voltage, $V_{WL}$ can be provided at a voltage less than or equal to the limit voltage to ensure safe operation.

Figure 1A:
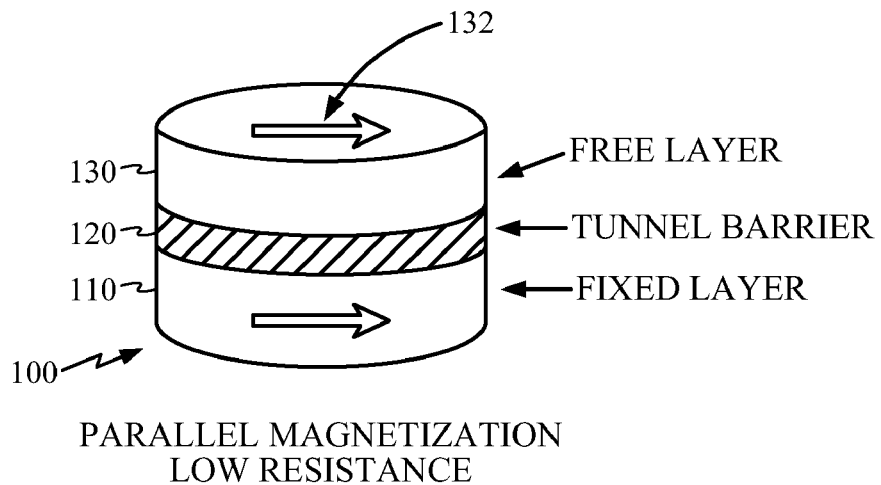
FIGS. 1A and 1B are illustrations of a magnetic tunnel junction (MTJ) storage element.
Figure 1B:
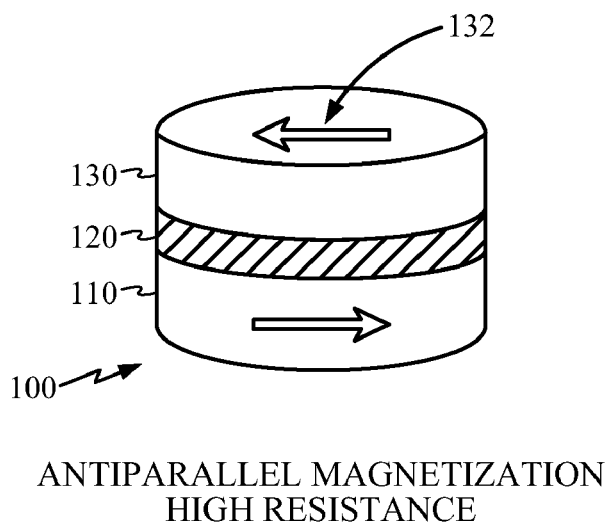
Figure 2A:
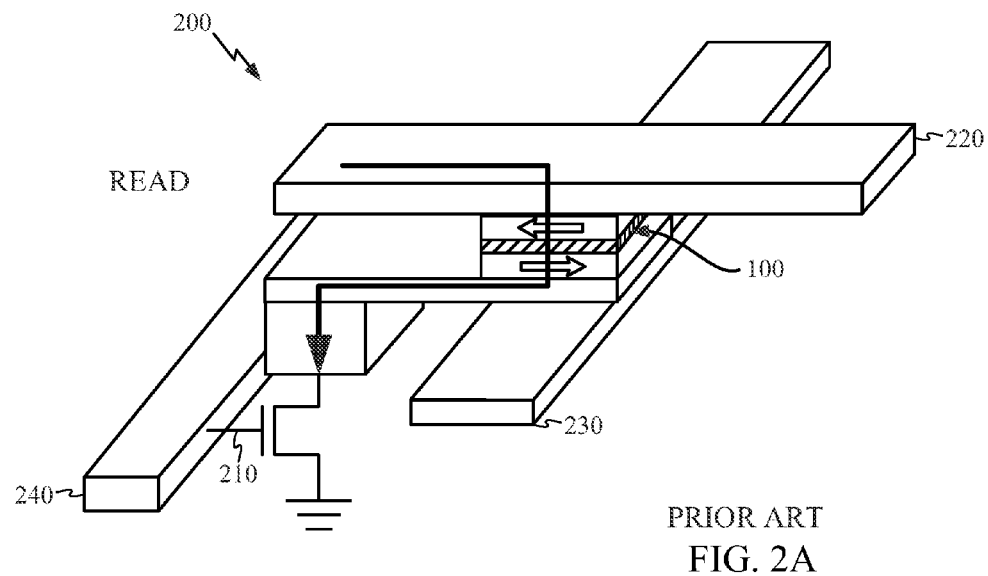
FIGS. 2A and 2B are illustrations of a Magnetoresistive Random Access Memory (MRAM) cell during read and write operations, respectively.
Figure 2B:
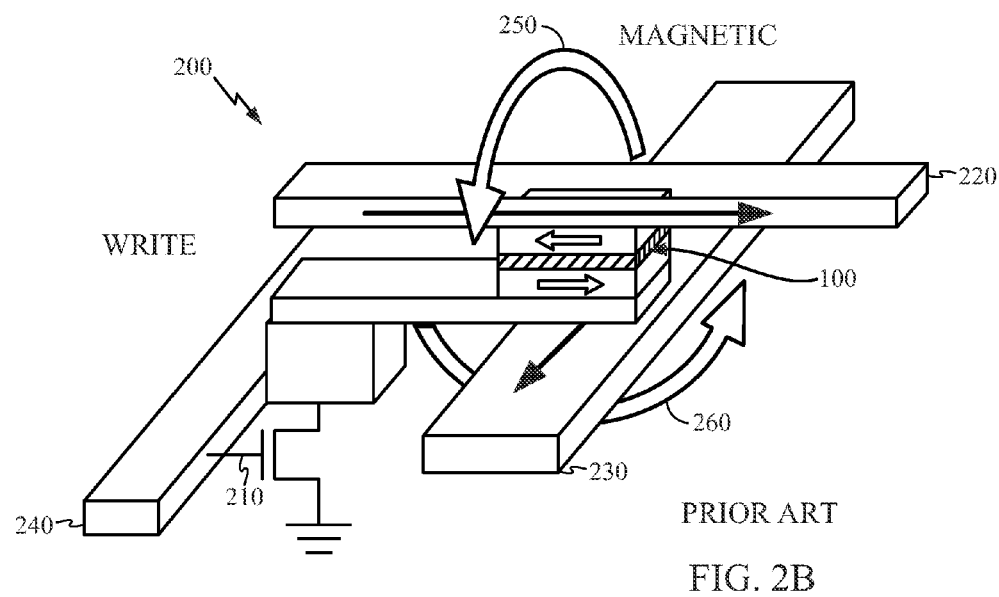
Figure 3A:
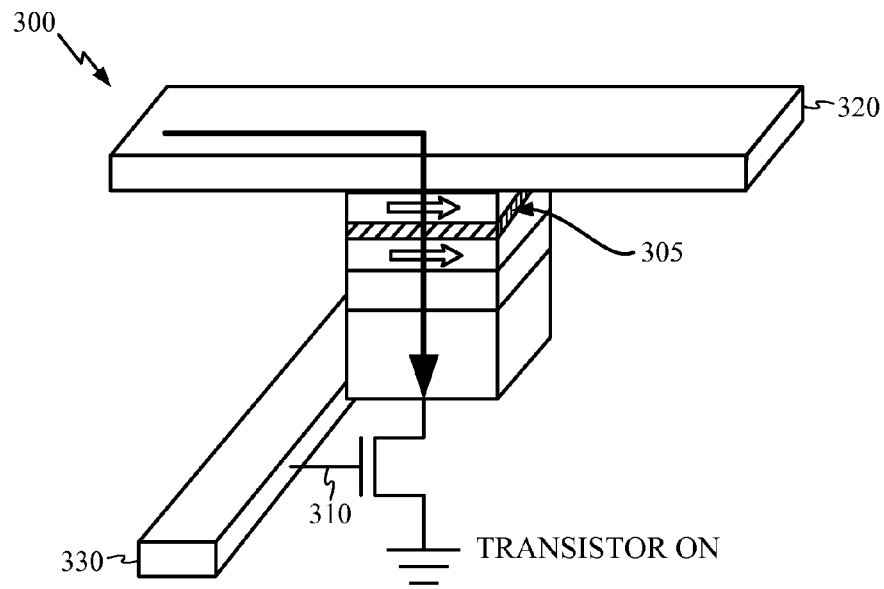
FIGS. 3A and 3B are illustrations of Spin Transfer Torque Magnetoresistive Random Access Memory (STT-MRAM) cells.
Figure 3B:
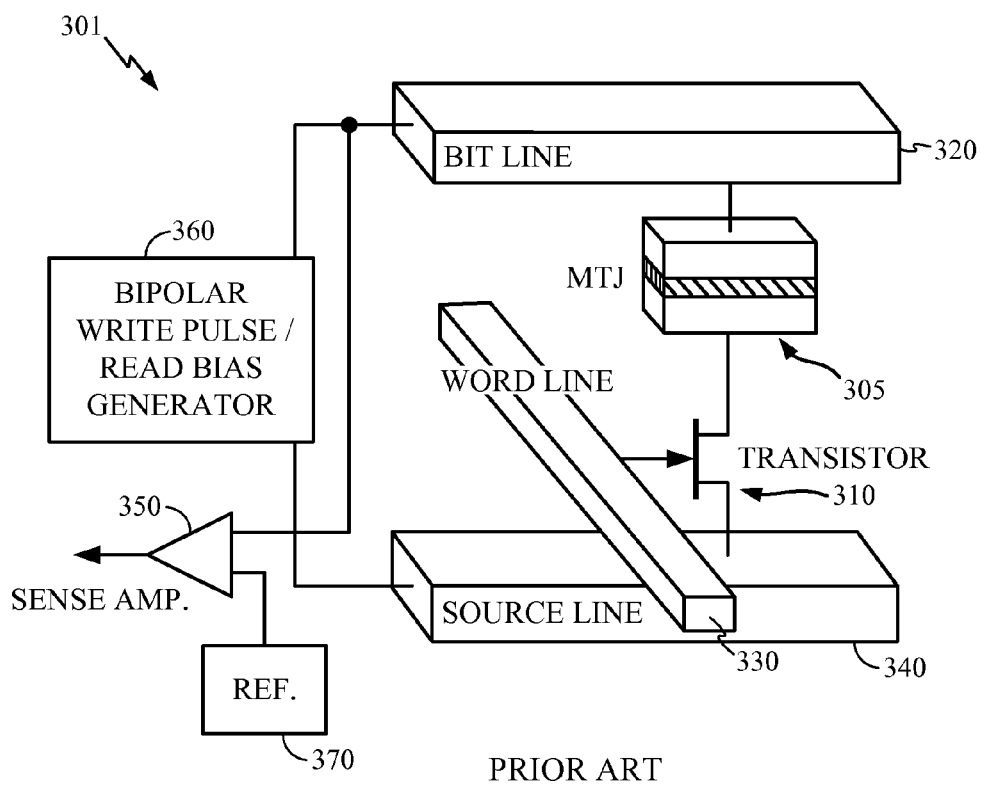
Figure 4A:
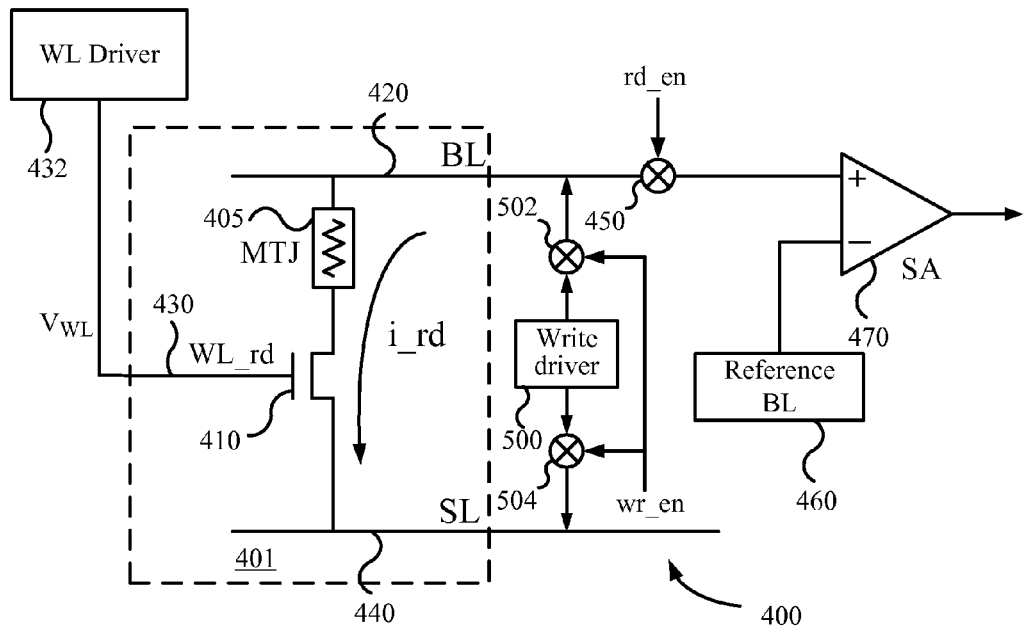
FIGS. 4A and 4B are illustrations of a circuit configuration in a STT-MRAM during read and write operations, respectively.
Figure 4B:
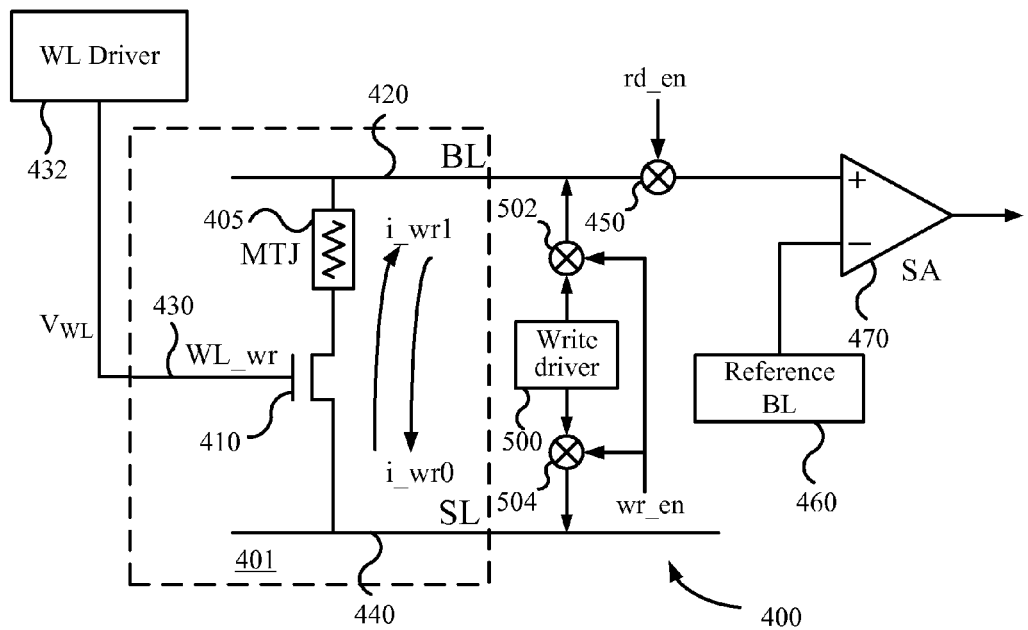

FIGS. 4A and 4B illustrate a circuit configuration 400 in a STT-MRAM during read and write operations, respectively. The circuit includes a bit cell 401 including a MTJ 405 and word line transistor 410 coupled between bit line (BL) 420 and source line (SL) 440. The word line transistor 410 is coupled to word line 430. A read isolation element 450 is coupled to the bit line 420 to isolate sense amplifier 470 during a write operation. Element 450 (e.g., read mux) can be used to select one of the bit lines during a read operation as well as providing sense amplifier isolation. As will be appreciated by those skilled in the art, read isolation element 450 can be any device or combination of devices that can couple the sense amplifier 470 to the bit line 420 during read operations and can isolate sense amplifier 470 during the write operations. For example, the isolation element 450 can be a transmission gate coupled in series with an input of sense amplifier 470. However, those skilled in the art will appreciate that other devices and/or combinations of devices such as multiplexers and the like may be used. Further, it will be appreciated that the circuit configuration illustrated herein is merely to facilitate the description of aspects of embodiments of the invention and is not intended to limit the embodiments to the illustrated elements and/or arrangements.

With reference to the read operation of FIG. 4A in particular, the isolation element 450 can receive a read enable signal (rd_en) to coordinate the read operation. A sense amplifier 470 is coupled to the bit line 420 and to a reference 472. Sense amplifier 470 can be used to determine the state of the bit cell 401 by amplifying the voltage differential between the bit line 420 and the reference 472 at the input of the sense amplifier 470 during the read operation. During the read operation transistor 410 is conducting and a read current (i_rd) flows through the MTJ 405. The read isolation element 450 will be conducting and a voltage in proportion to the resistance of the MTJ 405 will be generated and detected at sense amplifier 470. As discussed above, the resistance will vary based on the logic state of the MTJ 405. Accordingly, the data stored in bit cell 401 can be read.

Figure 5:
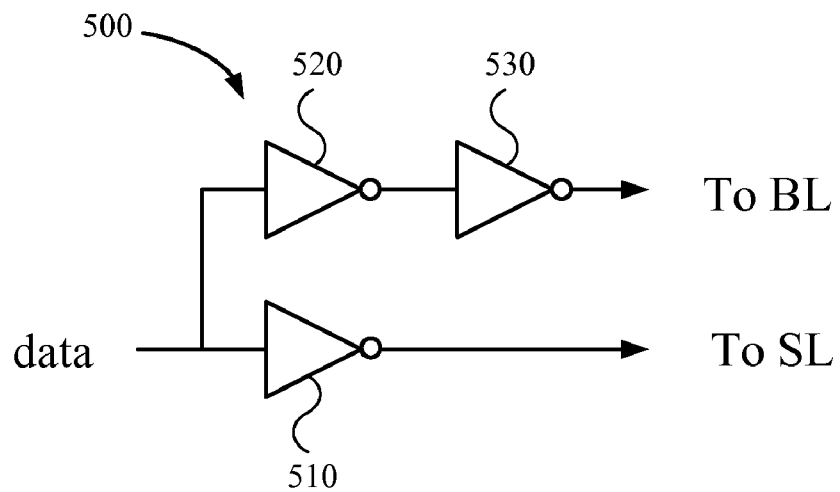
FIG. 5 is an illustration of a circuit configuration for a write driver for a STT-MRAM.

With reference now to the write operation of FIG. 4B in particular, a write driver 500 and write isolation elements 502 and 504 are coupled between the bit line 420 and source line 440 to enable selection of a bit line and writing data to bit cell 401. As discussed above and illustrated in FIG. 4B, in a STT MRAM, passing current through the MTJ 405 can change the polarity of the free layer which in turn changes the resistance of the MTJ 405. This change of resistance can then be detected as a change of logic state of the bit cell 401. For example, a first write current (i_wr0) can flow in a first direction to write a "0" logic state. A second write current (i_wr1) can flow in a second direction opposite to the first direction to write a "1" logic state. The write isolation elements 502 and 504 can be any device or combination of devices that can selectively couple and decouple the write driver 500. For example, the write isolation elements 502 and 504 can be transmission gates coupled in series with the write driver 500. Further, the write isolation elements can receive a write enable signal (wr_en) to coordinate coupling the write driver 500 during the write operation. However, those skilled in the art will appreciate that the write isolation elements 502 and 504 can be other devices and/or combinations of devices such as multiplexers and the like, which can be used to achieve the same functionality. Referring to FIG. 5, a circuit configuration for write line driver 500 is illustrated. The write line driver 500 can include a plurality of inverters 510, 520 and 530 configured to differentially drive the bit line (BL) and source line (SL) based on a received data input that is to be written to the bit cell.

Figure 6:
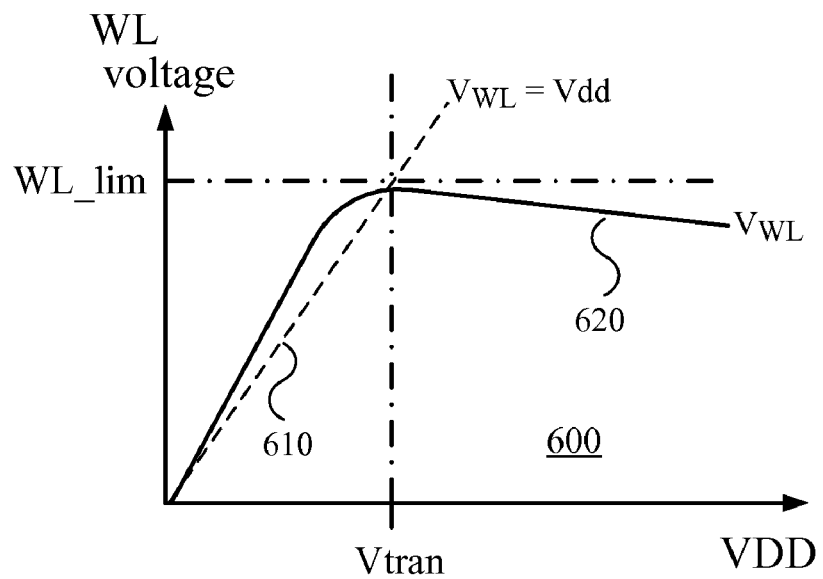
FIG. 6 is a graph illustrating the word line voltage applied at the word line transistor for various values of the core operating voltage.

Referring back to FIGS. 4A and 4B, word line driver 432 is coupled to the word line 430 and word line transistor 410 to provide the WL voltage $V_{WL}$ according to various embodiments of the invention. The WL voltage $V_{WL}$ can be generated by word line driver 432 using a pumping voltage Vpp, internal supply voltage (e.g., in embedded applications) or external supply voltage that is greater than the core voltage. Word line driver 432 can change the WL voltage $V_{WL}$ applied to transistor 410 to maintain a higher voltage than Vdd for low Vdd levels, and then to maintain or transition to a lower voltage when Vdd is at higher levels. (FIG. 6 illustrates an example of this function.) Word line driver 432 can thus be configured to provide a desired voltage level during both the read operations of FIG. 4A and the write operations of FIG. 4B.

For example, the word line voltage $V_{WL}$ could be a multiple of Vdd (e.g., N1*Vdd, where N1 is a real number greater than 1). In some embodiments the word line driver 432 can supply a voltage that is on the order of 40% to 100% greater than Vdd, when Vdd is a relatively low value. Embodiments of the invention are not limited to this range and the word line voltage $V_{WL}$ output from word line driver 432 can be substantially higher.

As $V_{WL}$ increases with increasing Vdd, however, a potential for damage to various circuit elements may exist. For example, if $V_{WL}$ increases to a level that would exceed the breakdown voltage of word line transistor (or access transistor) 410, MTJ 405, or other elements coupled in the bit cell, the memory may be damaged. Accordingly, word line driver 432 is capable of operating in two regions: a low Vdd region and a high Vdd region. The transition between operating regions occurs at a value of Vdd referred to as a transition voltage Vtran, which is related to the breakdown voltage of word line transistor 410, MTJ 405, or other elements coupled in the bit cell.

In the low Vdd region (Vdd<Vtran), $V_{WL}$ may be output by word line driver 432 at a higher voltage than Vdd, such as the multiple of Vdd discussed above, or may be further conditioned by word line driver 432. In the high Vdd region (Vdd>Vtran), VWL may be maintained at or below a limit voltage level (see, WL_lim in FIG. 6) to prevent breakdown of word line transistor 410, MTJ 405, or other elements coupled in the bit cell, and provide safe operation of the memory. In this region, word line driver 432 may maintain $V_{WL}$ at a relatively constant level (e.g., equal to or near WL_lim at the transition point Vdd =Vtran). For example, word line driver 432 may include a clamping circuit or the like to clamp $V_{WL}$ at the transition voltage and prevent breakdown of MTJ 405 as Vdd increases. Alternatively, the word line driver 432 may further reduce the word line voltage Vpp to a lower level creating a negative slope of the WL voltage $V_{WL}$ after the transition voltage (see, e.g., FIG. 6). It will be appreciated that the terms 'high Vdd' and 'low Vdd' as applied to the different operating regions are relative terms and not intended by themselves to impart any particular absolute voltage values or ranges to their respective operating regions, as these can vary based on the properties the circuit elements (e.g., breakdown voltage as discussed above).

FIG. 6 is a graph 600 illustrating the word line voltage applied at the word line transistor for various values of Vdd. As illustrated, the reference line 610 is Vdd. The word line voltage $V_{WL}$ is proportionally greater than Vdd in a low Vdd region (i.e., where Vdd is less than Vtran). In a high Vdd region (i.e., where Vdd is greater than Vtran), the $V_{WL}$ can be maintained at a substantially constant level according to one embodiment of the invention. Alternatively, as illustrated in 620, $V_{WL}$ can be reduced according to another embodiment of the invention. This ensures that $V_{WL}$ will not cause the write voltage to exceed the MTJ breakdown voltage and/or damage other elements in the memory.

As discussed above, the WL voltage $V_{WL}$ can be generated using a pumping voltage Vpp, internal supply voltage (e.g., in embedded applications) or external supply voltage that is greater than the core voltage. Accordingly, graph 600 is provided merely for the purpose of illustration and is not intended to limit the embodiments of the invention. For example, the word line voltage 620 could be a multiple of Vdd (e.g., N1*Vdd, where N1 is a real number greater than 1) in the low Vdd region, and the difference between word line voltage 620 and Vdd would be an increasing function as Vdd increased up to Vtran. In the high Vdd region, a write voltage could be a desired fixed value, or a multiple of a pumping voltage Vpp that results in a word line voltage $V_{WL}$ being less than a breakdown voltage (e.g., N2*Vpp, where N2 is a real number less than 1). However, regardless of the strategy for generating the WL voltage $V_{WL}$, as long as $V_{WL}$ is greater than Vdd at low voltages (Vdd<Vtran) and is maintained below a breakdown voltage or predetermined voltage for high Vdd voltages (Vdd>Vtran), a decrease in the potential for an invalid write operation and/or potential damage to system components while increasing performance can be achieved.

Referring back to FIGS. 4A and 4B, the word line driver 432 can be configured to supply the word line with different voltage levels and to limit the WL voltage $V_{WL}$ to avoid reaching the MTJ breakdown voltage. The word line driver 432 can include logic to generate the first voltage (e.g., $V_{WL}$>Vdd) for Vdd<Vtran and logic to generate the second voltage level (e.g., $V_{WL}$<VPP) for Vdd>Vtran. The second voltage level can be generated by logic configured to maintain the word line voltage at or below a desired threshold to avoid MTJ breakdown. $V_{WL}$ can be supplied from an integrated power source, such as from a power management integrated circuit or from other external supplies. Alternatively, $V_{WL}$ can be generated from Vdd using a pumping circuit, for example, as is known in the art.

Figure 7:
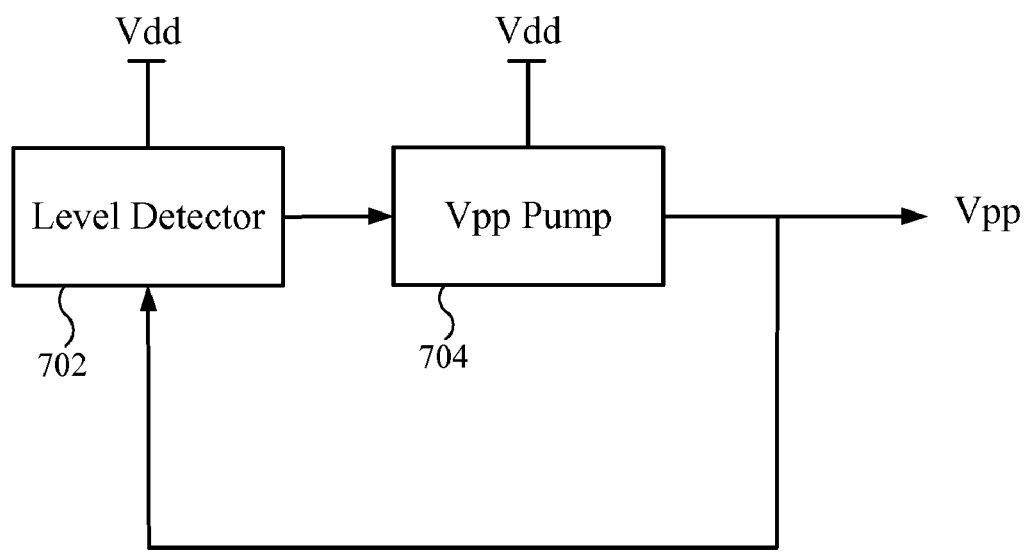
FIG. 7 illustrates a pumping circuit design of the word line driver of FIGS. 4A and 4B according to one embodiment of the invention.

FIG. 7 illustrates a pumping circuit design of the word line driver of FIGS. 4A and 4B according to one embodiment of the invention.

As shown, word line driver 432 includes a level detector 702 and a Vpp charge pump 704 to output the WL voltage $V_{WL}$ as a pumping voltage Vpp. Level detector 702 determines the appropriate level of Vpp for the operating conditions based on a supplied Vdd input (FIG. 6 illustrates an example Vdd vs. Vpp relationship), and controls Vpp pump 704 to output the desired Vpp voltage level in accordance with a feedback signal from Vpp pump 704. As is known in the art, level detector 704 can be designed to output a desired function of the input, such as in accordance with the $V_{WL}$ curve 620 of FIG. 6, including increasing or decreasing function, as well as clamping functions. Level detectors and charge pumps are well known in the art, and a further description here will therefore be omitted.

Figure 8:
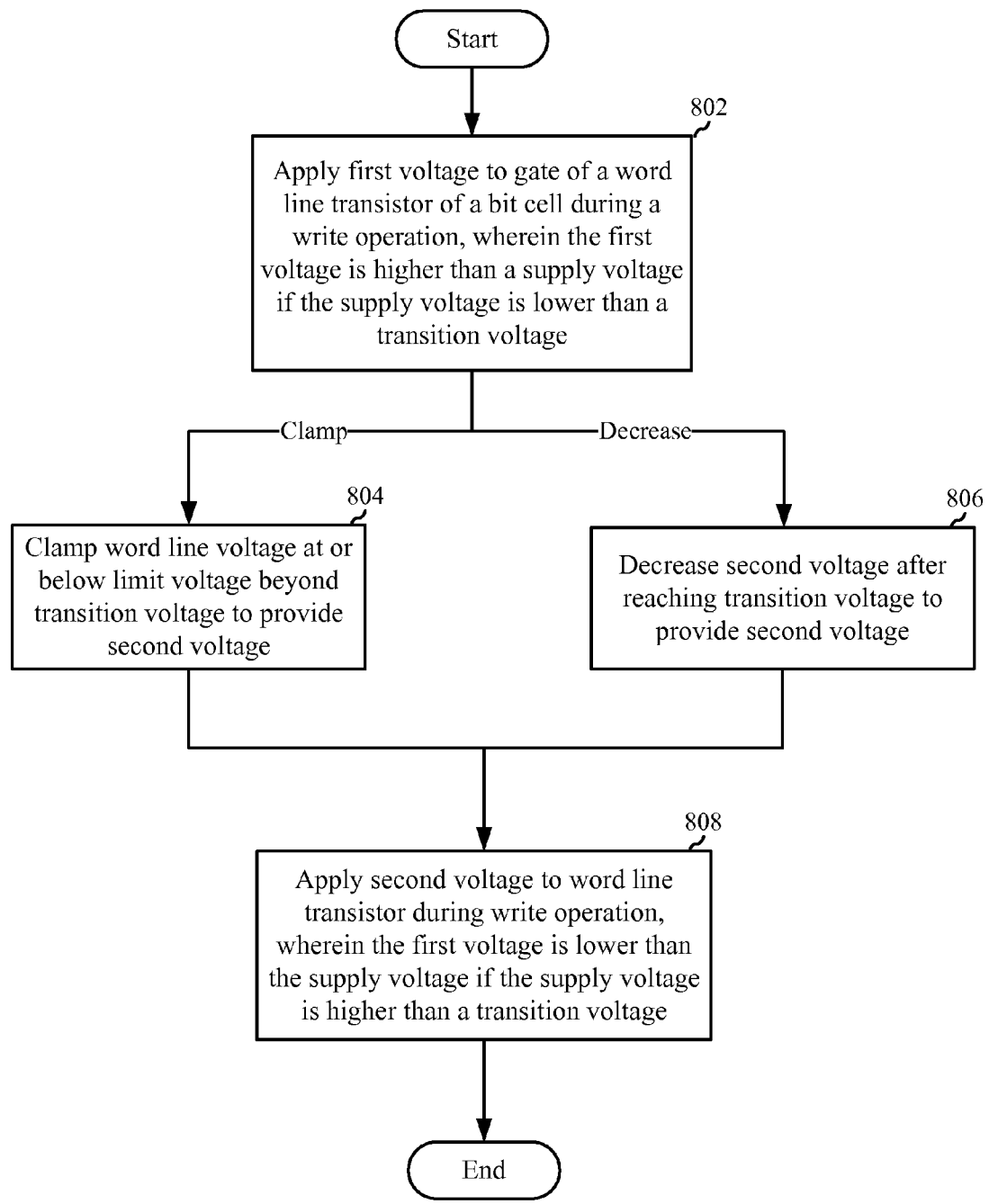
FIG. 8 illustrates a method for read and write operations in a STT-MRAM.

In view of the foregoing, it will be appreciated that embodiments of the invention can also include methods for performing the functions, sequence of actions and/or algorithms described herein. For example, FIG. 8 illustrates a method for read and write operations in a Spin Transfer Torque Magnetoresistive Random Access Memory (STT-MRAM) according to an embodiment of the invention. The method includes applying a first voltage to a gate of a word line transistor of a bit cell during a write operation, wherein the first voltage is higher than a supply voltage if the supply voltage is lower than a transition voltage (block 802) and applying a second voltage to the word line transistor during a write operation, wherein the first voltage is lower than the supply voltage if the supply voltage is higher than a transition voltage (block 808). The method may further include clamping the word line voltage at or below a limit voltage beyond the transition voltage to provide the second voltage (block 804) or decreasing the second voltage after reaching the transition voltage to provide the second voltage (block 806).

While the foregoing disclosure shows illustrative embodiments of the invention, it should be noted that various changes and modifications could be made herein without departing from the scope of embodiments of the invention as defined by the appended claims. For example, specific logic signals corresponding to the transistors/circuits to be activated, may be changed as appropriate to achieve the disclosed functionality as the transistors/circuits may be modified to complementary devices (e.g., interchanging PMOS and NMOS devices). Likewise, the functions, steps and/or actions of the methods in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A Spin Transfer Torque Magnetoresistive Random Access Memory (STT-MRAM) comprising:
    a bit cell having a magnetic tunnel junction (MTJ) and a word line transistor, wherein the bit cell is coupled to a bit line and a source line; and
    a word line driver coupled to a gate of the word line transistor, wherein the word line driver is configured to provide a word line voltage greater than a supply voltage below a transition voltage of the supply voltage and to provide a voltage less than the supply voltage for supply voltages above the transition voltage.

2. The STT-MRAM of claim 1, wherein the word line voltage is clamped at or below a limit voltage after reaching the transition voltage.

3. The STT-MRAM of claim 2, wherein the word line voltage is decreased after reaching the transition voltage.

4. The STT-MRAM of claim 1, wherein the transition voltage represents a transition between a low Vdd region and a high Vdd region.

5. The STT-MRAM of claim 1, further comprising:
    a write driver configured to provide an electrical signal to the bit cell to store a logic state in the bit cell; and
    at least one write isolation element coupled in series with the write driver between the bit line and source line, wherein the write isolation element is configured to isolate the write driver during a read operation.

6. The STT-MRAM of claim 5, wherein the write driver comprises:
    first and second inverters coupled in series between a data input and the bit line; and
    a third inverter coupled in series between the data input and the source line.

7. The STT-MRAM of claim 1, further comprising:
    a read isolation element interposed between the bit cell and a sense amplifier, wherein the isolation element is configured to selectively isolate the sense amplifier from the bit line during a write operation.

8. The STT-MRAM of claim 7, wherein the read isolation element is at least one of a switch, a transmission gate, or a multiplexer.

9. The STT-MRAM of claim 1, further comprising:
    a voltage pump circuit configured to generate the word line voltage from the supply voltage.

10. The STT-MRAM of claim 9, further comprising:
    a level detector configured to control the voltage pump circuit to generate the word line voltage from the supply voltage.

11. A method for read and write operations in a Spin Transfer Torque Magnetoresistive Random Access Memory (STT-MRAM) comprising:
    applying a first voltage to a gate of a word line transistor of a bit cell during a write operation, wherein the first voltage is higher than a supply voltage if the supply voltage is lower than a transition voltage; and
    applying a second voltage to the word line transistor during a write operation, wherein the second voltage is lower than the supply voltage if the supply voltage is higher than a transition voltage.

12. The method of claim 11, further comprising:
    clamping the word line voltage at or below a limit voltage beyond the transition voltage to provide the second voltage.

13. The method of claim 11, further comprising:
decreasing the second voltage after reaching the transition voltage to provide the second voltage.

14. The method of claim 11, wherein the transition voltage represents a transition between a low Vdd region and a high Vdd region.

15. The method of claim 11, further comprising:
pumping the supply voltage to generate the first voltage using a charge pump circuit.

16. A Spin Transfer Torque Magnetoresistive Random Access Memory (STT-MRAM) comprising:
means for applying a first voltage to a gate of a word line transistor of a bit cell during a write operation, wherein the first voltage is higher than a supply voltage if the supply voltage is lower than a transition voltage; and
means for applying a second voltage to the word line transistor during a write operation, wherein the second voltage is lower than the supply voltage if the supply voltage is higher than a transition voltage.

17. The STT-MRAM of claim 16, further comprising:
means for clamping the word line voltage at or below a limit voltage after reaching the transition voltage to provide the second voltage.

18. The STT-MRAM of claim 16, further comprising:
means for decreasing the second voltage after reaching the transition voltage to provide the second voltage.

19. The STT-MRAM of claim 16, wherein the transition voltage represents a transition between a low Vdd region and a high Vdd region.

20. The STT-MRAM of claim 16, further comprising:
means for pumping the supply voltage to generate the first voltage using a charge pump circuit.

21. The STT-MRAM of claim 1, wherein the word line driver is configured to create a negative slope of the word line voltage with respect to the supply voltage after the transition voltage.

* * * * *